United States Patent [19]

Smith

[11] Patent Number: 4,751,612

[45] Date of Patent: Jun. 14, 1988

[54] CONSTRUCTION FOR ATTACHING A COMPONENT TO A SUBSTRATE

[75] Inventor: Paul R. Smith, Chester, N.J.

[73] Assignee: RCA Corporation, Princeton, N.J.

[21] Appl. No.: 105,934

[22] Filed: Oct. 8, 1987

[51] Int. Cl.⁴ .............................................. H05K 7/12
[52] U.S. Cl. ............................... 361/400; 174/138 D; 174/138 G; 211/26; 211/41; 361/398; 361/419; 361/420
[58] Field of Search ..................... 174/138 D, 138 G; 211/26, 41; 248/417; 361/398, 403, 412, 417, 418, 419, 420, 408

[56] References Cited

U.S. PATENT DOCUMENTS

| | | | |
|---|---|---|---|
| 2,703,853 | 3/1955 | Chrystie | 361/398 X |
| 3,216,580 | 11/1965 | Fricker, Jr. | 211/41 |
| 3,567,998 | 3/1971 | Ammerman | 317/101 |
| 3,621,173 | 11/1971 | O'Chesky | 174/138 G |
| 3,705,377 | 12/1972 | Hansen et al. | 211/26 X |
| 3,710,303 | 1/1973 | Gallager, Jr. | 339/61 M |
| 3,848,952 | 11/1974 | Tighe, Jr. | 174/138 D X |
| 3,852,849 | 12/1974 | Pestka | 174/138 D X |
| 3,898,791 | 8/1975 | Wolber | 361/419 X |
| 3,947,984 | 4/1976 | Winrow | 174/138 D X |
| 4,143,932 | 3/1979 | Boutros | 361/398 X |
| 4,360,858 | 11/1982 | Fahling | 361/398 X |
| 4,495,546 | 1/1985 | Nakamura et al. | 361/398 |
| 4,636,915 | 1/1987 | Perkins et al. | 174/138 D X |
| 4,688,328 | 8/1987 | Jebens et al. | 29/839 |

Primary Examiner—R. R. Kucia
Attorney, Agent, or Firm—William Squire; Fred Jacob

[57] ABSTRACT

A speaker having a slotted flange is attached by a robot to printed circuit board mounting posts. The posts are slotted and dimensioned so the post slots are slid into engagement with the flange slots in interlocking arrangement. The posts and flange are dimensioned so that a robot hand can slide the flange between the posts in interference fit such that the relatively rigid posts are torqued apart flexing the board. When the flange and post slots engage, the board flex forces snap the posts and flange in locked engagement.

14 Claims, 3 Drawing Sheets

CONSTRUCTION FOR ATTACHING A COMPONENT TO A SUBSTRATE

This invention relates to a construction wherein one member is locked to a second member with a snap action.

Of interest is co-pending application Ser. No. 060,945, filed June 11, 1987, entitled "Printed Circuit Board Assembly And Method For The Manufacture Thereof," by Robert Warren Jebens et al., which is a continuation of Ser. No. 811,824, filed Dec. 20, 1985, abandoned, and U.S. Pat. No. 4,688,328 which is a division of Ser. No. 811,824, and co-pending application Ser. No. 811,274, filed Dec. 20, 1985, entitled "Electrical Module And Method For The Manufacture Thereof," by Paul Russell Smith, all of which are assigned to the assignee of the present invention.

Printed circuit board assemblies are widely used in the manufacture of electronic systems. These assemblies include semiconductor devices such as transistors and integrated circuits secured to conductors on printed circuit board substrates. Mechanical and electrical structures are also often secured to the printed circuit board substrates. Often, the mechanical components such as speakers and other structures are fastened by screws, rivets and other fastening devices to an electronic module including a printed circuit board assembly. Such fastening devices are relatively costly to install due to the complexity of automatic apparatus required to assemble such fasteners.

Ideally components should be assembled to an electronic module employing robotic systems wherein the use of fasteners requiring a critical alignment, or complex motions such as turning as employed in screws and similar structures are avoided wherever possible. The present inventor recognizes a need for a simplified construction adaptable for use by a robot, which construction provides a secure arrangement in which mechanical and electronic components can be efficiently attached to an electronic module.

In accordance with the present invention a construction is provided for attaching a component to a substrate. The component includes a component mounting support having a first dimension between spaced mounting portions. A plurality of spaced relatively rigid component support members are secured to a sheet material substrate. The members include lock means spaced and adapted to receive, engage and secure the component support mounting portions in interlocking engagement. The lock means have a second dimension different than the first dimension tending to interfere with the securing of a component to the support members. The substrate is sufficiently flexible such that it tends to displace in response to flexing, by an amount and in a direction sufficient to substantially alleviate the interference. This permits the lock means to engage the component support mounting portions at the first dimension. The component interlocks with the members upon the substrate returning to the given state after engagement.

IN THE DRAWING

Figure 1:
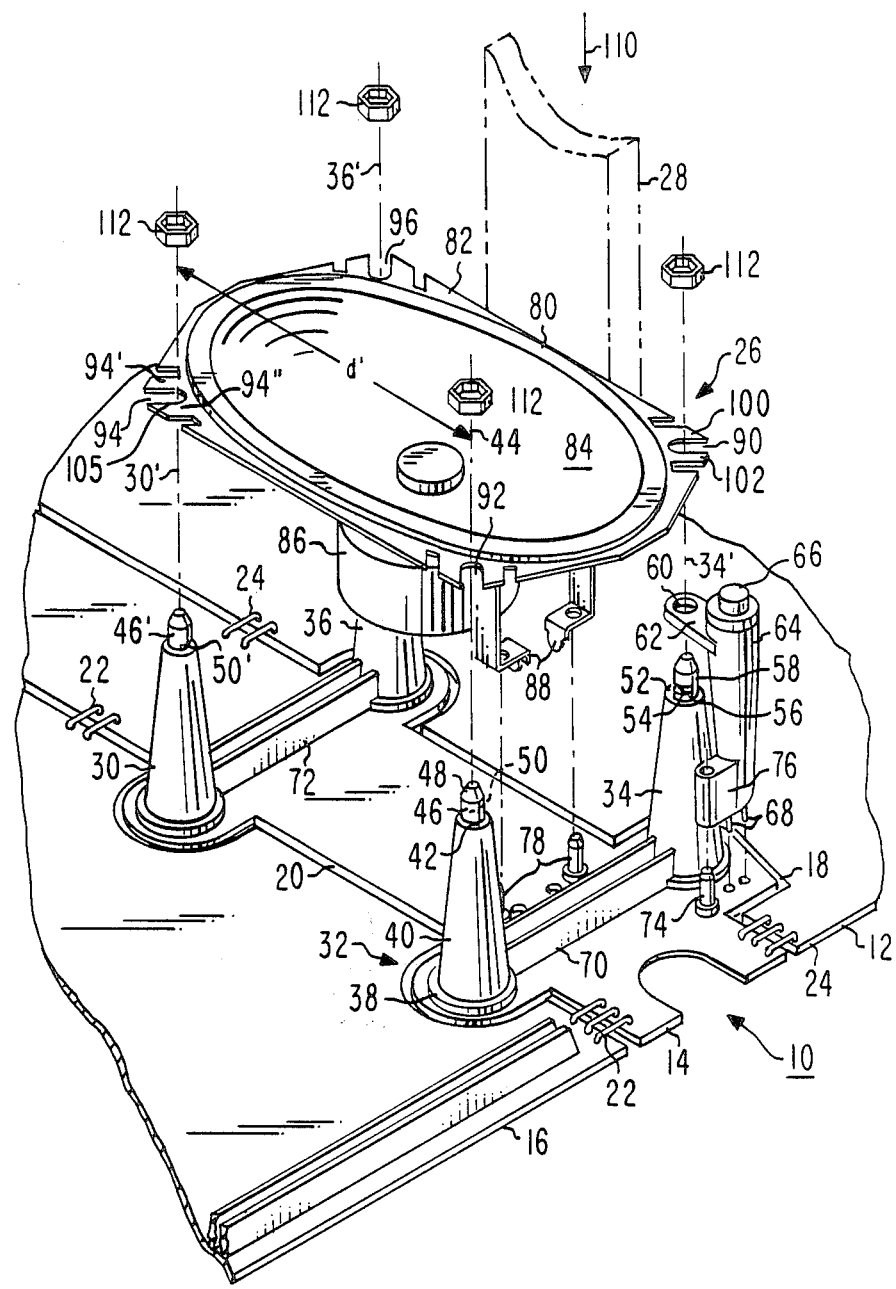
FIG. 1 is an isometric exploded view of a component to be secured to a substrate in accordance with one embodiment of the present invention.
Figure 2:
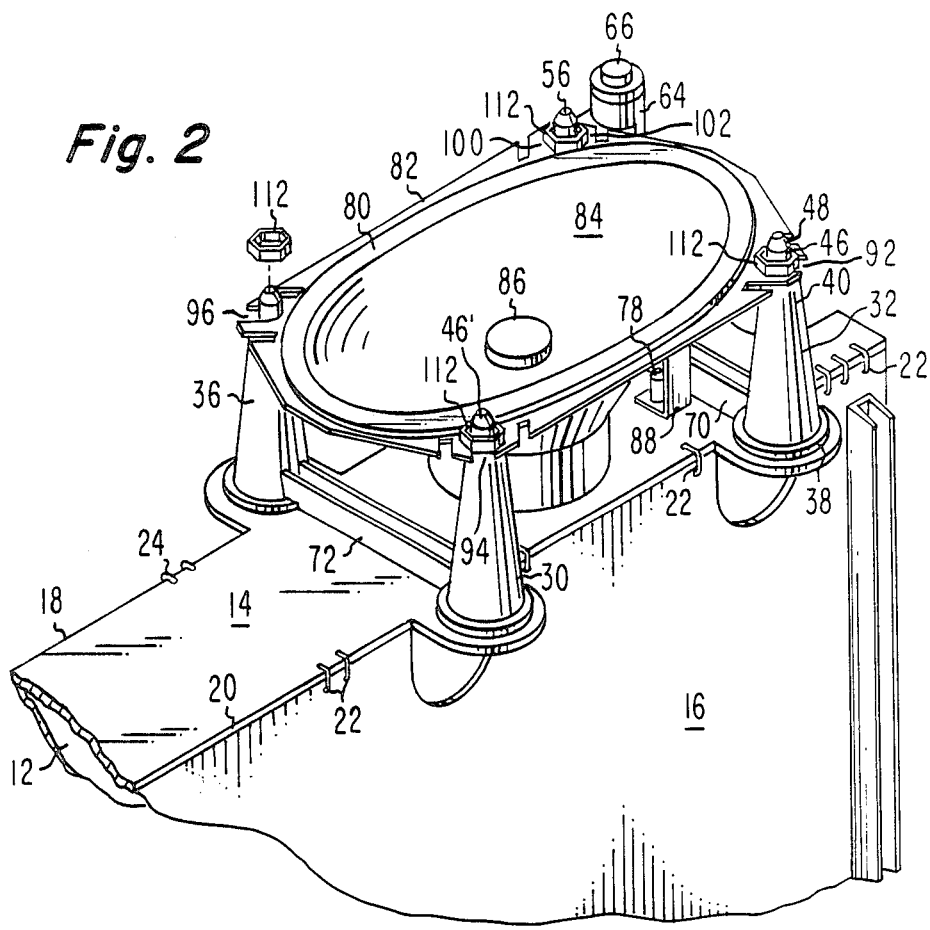
FIG. 2 is an isometric view of the embodiment of FIG. 1 where the component is secured in place to the substrate.
Figure 5:
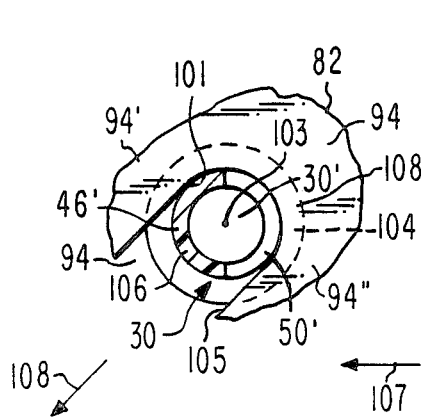
Figure 6:
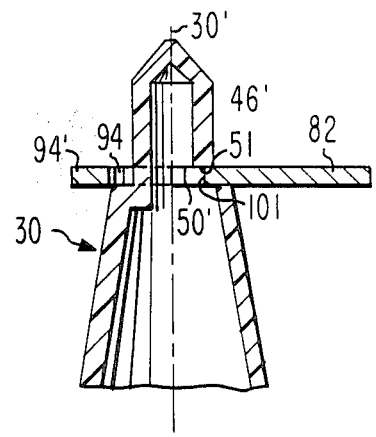
Figure 3:
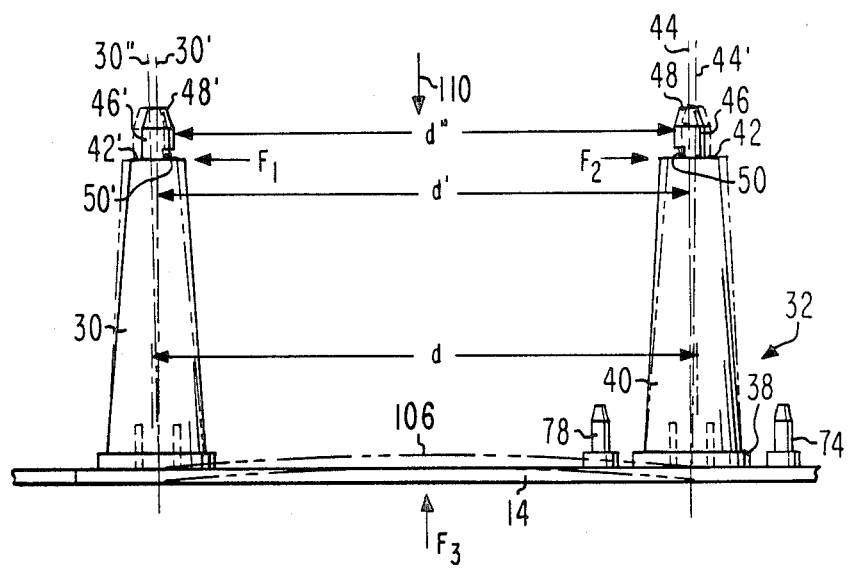
Figure 4:
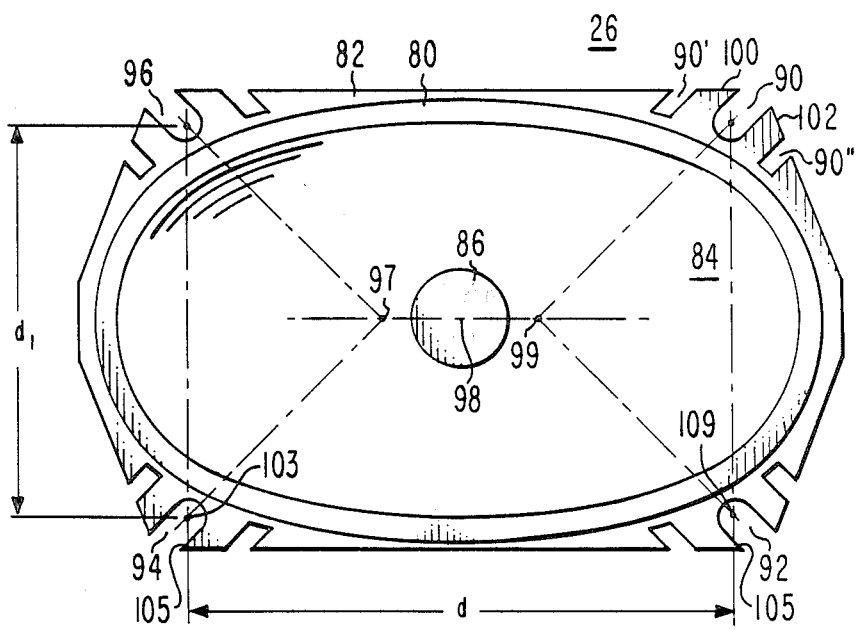

FIG. 3. is a side elevation view of the component support structure and substrate of the embodiment of FIG. 2;

FIG. 4 is a plan view of the component of FIG. 1;

FIG. 5 is a sectional plan view illustrating the relationship between a component mounting flange and the mating support structure prior to assembly; and FIG. 6 is a sectional elevation view similar to that of FIG. 5 after assembly.

In the different Figures, the same reference numerals refer to identical parts. In FIG. 1, electronic module 10 comprises a plurality of printed circuit boards 12, 14 and 16. The circuit boards 12, 14 and 16 are fabricated initially in a flat plane state. The boards as originally manufactured are a single unitary construction with dink openings (not shown) at the junctions 18 and 20 between the boards forming fracture lines. The boards are separated by bending them relative to each other along the dink openings in a known way. A fourth printed circuit board (not shown) is included in the module 10 to form a rectangular module as disclosed and described more fully in forementioned copending application Ser. No. 811,274.

The circuits of boards 12, 14 and 16 are interconnected with wire jumpers 22 and 24. The jumpers 22 connect board 14 to board 16 and jumpers 24 connect board 12 to board 14. The jumpers 22 and 24 also serve to structurally reinforce the joints between adjacent boards as also described more fully in the forementioned patent application Ser. No. 811,274.

Different electronic components such as speaker 26 and other components (not shown) are robotically assembled to the boards while the boards are in the flat state. It is desired that all electronic components including the speaker 26 be assembled to the module 10 with the boards 12, 14 and 16 coplanar for ease of assembly by a robotic system. The assembly, prior to separating the boards, is a unitary construction and the identification of the coordinates of the components at different points on the boards 12, 14 and 16 is a simple task for a robotic system.

One problem, however, is robotically assembling the different components such as speaker 26 to the assembly. This requires the robot, not only to align the speaker appropriately with the mating elements on the module 10 boards, but also to insure that the speaker is firmly locked in place. The structure described herein permits the speaker 26 to be attached to board 14 by a robot as represented by a robot hand 28 shown in phantom. The hand 28 is symbolic as in practice it may comprise a number of fingers for grasping the speaker 26 at a plurality of edges of the speaker.

A set of four conical hollow, uniform wall thickness, relatively rigid frustrum stanchions 30, 32, 34 and 36 are secured to board 14 for receiving the speaker 26. The stanchions are all molded simultaneously to board 14 in situ in mating circular apertures (not shown) in board 14. The methodology for molding the stanchions is described more fully in the forementioned co-pending application Ser. No. 060,945. Other methods for attaching the stanchions may also be used. Stanchion 32 comprises a circular flange base portion 38 locked to board 14 and an upstanding conical frustrum portion 40. Portion 40 adjacent its narrowest upstanding end has a circular plane shoulder 42. Upstanding centrally from shoulder 42 centered on portion 40 longitudinal axis 44 is a circular cylindrical projection 46. Projection 46 includes a tapered end 48 which narrows toward its upper end in a conical frustrum. Projection 46 includes a slot 50 as best seen in FIG. 3. A side wall of slot 50 is coplanar with shoulder 42.

Stanchion 32 as described thus far is substantially the same as stanchions 30 and 36, FIG. 1. Stanchion 34 differs from the remaining three stanchions in that it has a annular shoulder 52 spaced closer to board 14 than shoulder 42 of the remaining stanchions. Its slot 54 is spaced from shoulder 52 whereas the corresponding slots 50 and 50' of the remaining stanchions, such as slot 50 of stanchion 32, has one wall thereof formed by shoulder 42. The portion 56 of projection 58 of stanchion 34 spaced between slot 54 and shoulder 52 is dimensioned to receive aperture 60 of component 64 arm 62.

Component 64 includes a photosensor 66 which is electrically connected via terminals 68 to mating conductors (not shown) on board 14. The arm 62 after assembly is sandwiched between the speaker 26 and shoulder 52 of stanchion 34. Portion 56 of stanchion 34 passes through aperture 60 of arm 62 so that the slot 54 is above arm 62 and so that one side wall of slot 54 is coplanar with an arm 62 surface. Except for the portion just described the stanchion 34 is otherwise substantially the same in construction as stanchions 30, 32 and 36 in the manner of attachment to the board 14, in shape and general dimensions. Stanchion 30 has a longitudinal central axis 30', stanchion 36 has an axis 36' and stanchion 34 has an axis 34'.

Molded integrally with stanchions 32 and 34 and abutting board 14 is rib 70, and molded integrally with stanchions 30 and 36 and abutting board 14 is rib 72. Ribs 70 and 72 may be identical and are molded simultaneously with the stanchions. The ribs 70 and 72 are generally U-shaped structures and abut a surface of board 14 at the base of the U. The ribs 70 and 72 prevent the stanchions from rotating, since the stanchions are molded to the board 14 in circular apertures. The ribs 70 and 72 also provide additional strength to the stanchions and printed circuit board 14 structure.

A projection 74 is molded to the board 14 in substantially the same way as the stanchions and at the same time. Projection 74 receives the aperture of component 64 boss 76. A pair of identical upstanding projections 78 are also molded to board 14 in spaced relation.

As shown in FIGS. 1 and 4, speaker 26 includes an elliptical frame 80 secured to an outer somewhat rectangular sheet metal flange 82. Speaker cone 84 is secured to frame 80 and magnet structure 86. The speaker 26 includes a pair of electrical terminals 88. The terminals are apertured to receive the projections 78 on board 14 for mechanically securing the terminals to the board. The terminals include portions which pass through apertures in the board 14 for connection to printed circuitry on the underside of the board opposite ribs 70 and 72. The flange 82 includes four slots 90, 92, 94 and 96. Slots 94 and 96 extend radially from point 97, FIG. 4, aligned on longitudinal axis 98 of frame 80 and slots 90 and 92 extend radially from point 99 also aligned on axis 98.

Adjacent slot 90, FIG. 4, are a pair of radially extending slots 90' and 90" of identical shape and dimension. Similar slots are adjacent each of the slots 92, 94 and 96. The slots 90' and 90" permit the legs 100 and 102 of slot 90 and similar legs of each of the other slots 92–96 to be somewhat flexible and to bend in response to forces in different directions, the flange 82 being made of relatively flexible thin sheet metal.

In FIGS. 5 and 6, representative slot 94 has a semi-circular base wall edge 101 whose center is at 103 and has a pair of legs 94' and 94". FIG. 5 illustrates the relative positions of the flange 82 to the portion 46' just prior to engagement with the stanchion slot 50'. The diameter of the circle defined by edge 101 is slightly larger than the diameter of circular cylindrical portion 46' of stanchion 30. The spacing of leg 94' from leg 94" is the same as the diameter of the circle defined by edge 101. Slot 50' of stanchion 30 faces edge 105 of leg 94" to permit edge 105 to seat within that slot in direction 107. Edge 105 in FIG. 5 is shown not engaged with the slot 50' for simplicity of illustration. Normally, edge 105 is fully seated in slot 50' and is retained by the upper lip 51 of slot 50', as shown in FIG. 6.

Speaker slots 92 and 94, FIG. 4, have a center-to-center distance d from their semi-circular edge centers 103 and 109, respectively, which is the same as the center-to-center distance of the semi-circular edge centers of the slots 90 and 96 in a direction parallel to axis 98. The stanchions 30 and 32, FIG. 3, have their respective axes 30' and 44 spaced a distance d' which is smaller than distance d. The edges 105 and 105' of respective slots 94 and 92, FIG. 4, have a spacing parallel to distance d, which is parallel to direction 107, FIG. 5, and which is greater than than spacing d" of portions 46 and 46' of respective stanchions 32 and 30, FIG. 3. The spacing d" is between the rims of slots 50 and 50' formed by portions 46 and 46'. Thus, the edges 105 and 105', FIG. 4, of the speaker frame 82 can engage slots 50' and 50 when the frame 82 is between the stanchions coplanar with those slots. Similarly, the spacing of the respective slots of stanchions 34 and 36 relative to speaker slots 90 and 96 is the same as described above for stanchions 30, 32 and their corresponding speaker slots 94 and 92.

To assemble the speaker 26 to the stanchions the robot hand 28, FIG. 1, is displaced in direction 110 parallel to axes 30', 34', 36' and 44. The speaker flange slot 90 is aligned with axis 34', the flange slot 92 is aligned with axis 44, the flange slot 94 is aligned with axis 30' and flange slot 96 is aligned with axis 36'. As the speaker 26 is displaced in direction 110 toward board 14, the facing slot side walls, such as walls 105 of slot 94 and 105' of slot 92, engage the cylindrical portions such as portion 46' of stanchion 30 and portion 46 of stanchion 32 in interference fit. The edges of the side walls 105 and 105' of the speaker slots 94 and 92, respectively, initially engage the tapered ends of the corresponding stanchion cylindrical portions. Continued displacement in direction 110, FIG. 1, causes the circuit board 14 between ribs 70 and 72 to flex, as shown in phantom at 106, FIG. 3. There also may be some minimal flexing of the relatively rigid stanchions. In FIG. 3, as the speaker is pushed in direction 110 the flange 80 (not shown in FIG. 3) at its respective slots engage the corresponding facing circular cylindrical stanchion portions, such as portions 46, 46' and 58 of stanchions 32, 30 and 34, respectively. The speaker exerts forces $F_1$ and $F_2$ on respective stanchions 34 and 32. These forces torque the stanchions relative to board 14. That torque tends to induce a third force $F_3$ in a direction opposite direction 110 flexing the board 14 as shown in phantom. This flexing also tilts the stanchions 30 and 32, as shown in phantom, and causes their axes to tilt to the positions at 44' and 30".

The stanchions 32 and 34 are spread apart sufficiently by forces $F_1$, $F_2$ and $F_3$ to permit the stanchion speaker flange slots to engage the stanchion slots. It is possible that only the stanchions at one end of the speaker actually displace, such as stanchions 32 and 34. When the slots become engaged, the stanchions automatically snap to their original position and board 14 snaps back to its substantially plane position locking the printed circuit board in place. The stanchions may be dimensioned so that some permanent deflection may remain to insure positive locking of the elements. In this way the speaker can be assembled automatically to the board 14 by a simple pushing motion and locked thereto without fasteners. The slots 50 of stanchions 30 and 32 face one another parallel to distance d'. The slots 50 and 52 of stanchions 36 and 34 respectively also face each other parallel to direction d'. As a result, when the speaker is pushed onto the stanchions the insertion force components are substantially parallel to direction 107, FIG. 5. Board 14 can flex more readily when the forces are in these directions, because of the orientation of the ribs. Forces in normal directions are resisted by ribs 70 and 72, FIG. 1, which tend to resist the flexing of board 14. For this reason the slots of the stanchions are aligned in directions parallel to directions 107 to insure maximum torque is in these directions. With the speaker secured to the stanchions as shown in FIG. 2, flange 82 portion 108 rests on shoulder 104 of stanchion 30, FIG. 5.

As an additional precaution PAL type nuts 112, FIG. 1, may be inserted in direction 110 by a second robotic device (not shown) and pushed over the stanchion cylindrical portions such as portions 46, 46' and 58 frictionally locking the nuts to the stanchions in clutch-like engagement. After such engagement the assembly appears as in FIG. 2. In this way a speaker assembly can be automatically attached to a printed circuit board by a robotic system without the use of screws or other type of fastening elements which may require hand tools.

What is claimed is:

1. A construction for attaching a component to a substrate, said component including a component mounting support having a first dimension between spaced mounting portions, said construction comprising:
    a sheet material substrate; and
    a plurality of spaced relatively rigid component support members secured to the substrate, said members including lock means spaced and adapted to receive, engage and secure said component support mounting portions in interlocking engagement, said lock means having a second dimension different then the first dimension tending to interfere with the securing of the component to the support members, said substrate being sufficiently flexible such that it tends to displace in response to flexing an amount and in a direction sufficient to substantially alleviate said interference to permit said lock means to engage said component support mounting portions at said first dimension, said component being interlocked with said members upon said substrate returning to said given state after said engagement.

2. The construction of claim 1 wherein said substrate is a printed circuit board.

3. The construction of claim 1 wherein said support members comprise a plurality of stanchions spaced said second dimension, each stanchion lock means including a slot for securing one of said mounting portions, at least two of said stanchions forming a component receiving pair.

4. The construction of claim 1 wherein said support members comprise two spaced mating pairs, each pair having a slot for engaging said component mounting support, said slot of each pair being oriented to mate with said mounting support in the same directions.

5. The construction of claim 4 wherein one support member of each pair are precluded from rotating by a connecting rib which stiffens said sheet material between said one support member.

6. A snap-in construction for securing a component to a substrate, said component having a first dimension, said construction comprising:
    a sheet substrate tending to return to a given state when bent from that state; and
    a pair of rigid spaced members secured to the substrate, each member including a slot having a base wall and a rim wall, at least one of the rim walls of the each of the members facing each other in spaced relation a second dimension smaller than said first dimension, said substrate being sufficiently flexible so that said rim walls can be resiliently spaced apart a distance at least as great as said first dimension for slideably receiving said component at said first dimension therebetween until said said component at said first dimension engages said slots at which time said members tend to snap together and permit the substrate to return substantially to said given state thereby locking said component in said slots.

7. The construction of claim 6 wherein said members each comprise a base portion tapering toward an annular shoulder for receiving said component and a central cylindrical portion upstanding from said shoulder forming said at least one rim wall and adapted to receive a component locking nut.

8. The construction of claim 6 wherein said members include at least two pairs of spaced members, each pair including a slot, the slots of each pair cooperating to secure the component therebetween.

9. The construction of claim 8 wherein one member of each pair are secured to one another by a connecting rib 10. The construction of claim 6 wherein said substrate is adapted to receive a second component, said second component including a projection dimensioned to mate with one of said members and including means adapted to be secured so that the second component is between said first mentioned component and that one member.

11. A printed circuit board component securing structure, said component including a plurality of locking portions in fixed spaced relation, said structure comprising:
    a resilient printed circuit board that tends to return to the flat state when bent from that state; and
    a set of substantially rigid posts upstanding from the board in spaced relation, said posts each including a component receiving and locking slot, each slot adapted to receive and mate with a locking portion, said posts being arranged to lock said component thereto in post pairs, each post of a pair cooperating with the other post of that pair to lock the board thereto, the slots of each pair facing each other, said slots having a rim portion and a base portion, said rim portions of said facing slot pair being spaced a distance smaller than the spacing of said component locking portions mating with that slot pair, said board being sufficiently flexible so that said component locking portions tend to flex said board an amount sufficient for said locking portions to engage said facing mating slots.

12. A printed circuit board assembly comprising:
   a component having a flange, said flange including a plurality of aligned spaced slots in a first set;
   a planar printed circuit board substrate; and
   a plurality of upstanding posts secured in spaced relation to the substrate, said posts each having a tapered end portion distal said substrate and tapering to a narrower region away from the substrate, each post having a slot therein such that the slots thereof are aligned in a second set adapted to mate with the first set of said component slots, the end portions being dimensioned such that translation of the component toward the substrate with the first and second slot sets aligned tends to flex the substrate-post assembly until the second set of slots engage the first set and lock the flange thereto.

13. The assembly of claim 12 wherein said posts each have a shoulder, said shoulder being spaced from the slot of its post such that said flange abuts the shoulder when the first and second sets of slots engage.

14. The assembly of claim 12 wherein a first plurality of the posts each have a shoulder forming a side wall of the slot of that post, at least one other post having a shoulder spaced from the slot of its post, said assembly further including at least one component member secured to said at least one other post between the flange and shoulder of that at least one other post.

* * * * *